US011571751B2

(12) United States Patent
Fukushima

(10) Patent No.: US 11,571,751 B2
(45) Date of Patent: Feb. 7, 2023

(54) COATED CUTTING TOOL

(71) Applicant: TUNGALOY CORPORATION, Fukushima (JP)

(72) Inventor: Naoyuki Fukushima, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 0 days.

(21) Appl. No.: 17/352,666

(22) Filed: Jun. 21, 2021

(65) Prior Publication Data

US 2022/0009002 A1    Jan. 13, 2022

(30) Foreign Application Priority Data

Jul. 8, 2020    (JP) .............................. JP2020-117681

(51) Int. Cl.
| | | |
|---|---|---|
| *B32B 15/04* | (2006.01) | |
| *B32B 17/06* | (2006.01) | |
| *B23B 27/14* | (2006.01) | |
| *C23C 28/00* | (2006.01) | |
| *B23C 5/16* | (2006.01) | |

(Continued)

(52) U.S. Cl.
CPC ............ *B23B 27/148* (2013.01); *B23B 27/14* (2013.01); *B23C 5/16* (2013.01); *C23C 16/32* (2013.01); *C23C 16/34* (2013.01); *C23C 16/36* (2013.01); *C23C 16/403* (2013.01); *C23C 28/042* (2013.01); *C23C 28/044* (2013.01); *C23C 28/347* (2013.01); *C23C 30/005* (2013.01); *B23B 2224/04* (2013.01);

(Continued)

(58) Field of Classification Search
CPC . B23B 27/14; B23B 27/148; B23B 2228/105; B23C 5/16; C23C 16/34; C23C 16/36; C23C 16/403

USPC ......................................................... 428/698
See application file for complete search history.

(56) References Cited

U.S. PATENT DOCUMENTS

| | | | | |
|---|---|---|---|---|
| 2006/0035111 A1* | 2/2006 | Osada | ..................... | C23C 16/32 |
| | | | | 428/701 |
| 2014/0193622 A1 | 7/2014 | Stiens et al. | | |
| 2018/0369926 A1 | 12/2018 | Kodama et al. | | |

FOREIGN PATENT DOCUMENTS

| | | |
|---|---|---|
| JP | 2009-279693 A | 12/2009 |
| JP | 2014-526391 A | 10/2014 |
| WO | 2017/090765 A1 | 6/2017 |

* cited by examiner

*Primary Examiner* — Lauren R Colgan
(74) *Attorney, Agent, or Firm* — Studebaker & Brackett PC

(57) ABSTRACT

An object of the invention is to provide a coated cutting tool whose tool life can be extended by having excellent wear resistance and fracture resistance. The coated cutting tool includes: a substrate; and a coating layer formed on a surface of the substrate, in which the coating layer includes a lower layer, an intermediate layer, and an upper layer in this order from a substrate side to a surface side of the coating layer, the lower layer includes one or more Ti compound layers formed of a specific Ti compound, the intermediate layer contains TiCNO, TiCO, or TiAlCNO, the upper layer contains α-type $Al_2O_3$, an average thickness of the lower layer is 2.0 μm or more and 8.0 μm or less, an average thickness of the intermediate layer is 0.5 μm or more and 2.0 μm or less and is 10% or more and 20% or less of a thickness of the entire coating layer, an average thickness of the upper layer is 0.8 μm or more and 6.0 μm or less, and in the intermediate layer, a ratio of a length of CSL grain boundaries to a total length 100% of a total grain boundary is 20% or more and 60% or less.

20 Claims, 1 Drawing Sheet

(51) Int. Cl.
*C23C 16/36* (2006.01)
*C23C 16/40* (2006.01)
*C23C 16/32* (2006.01)
*C23C 16/34* (2006.01)
*C23C 30/00* (2006.01)
*C23C 28/04* (2006.01)

(52) U.S. Cl.
CPC ....... *B23B 2224/28* (2013.01); *B23B 2224/32* (2013.01); *B23B 2224/36* (2013.01); *B23B 2228/105* (2013.01)

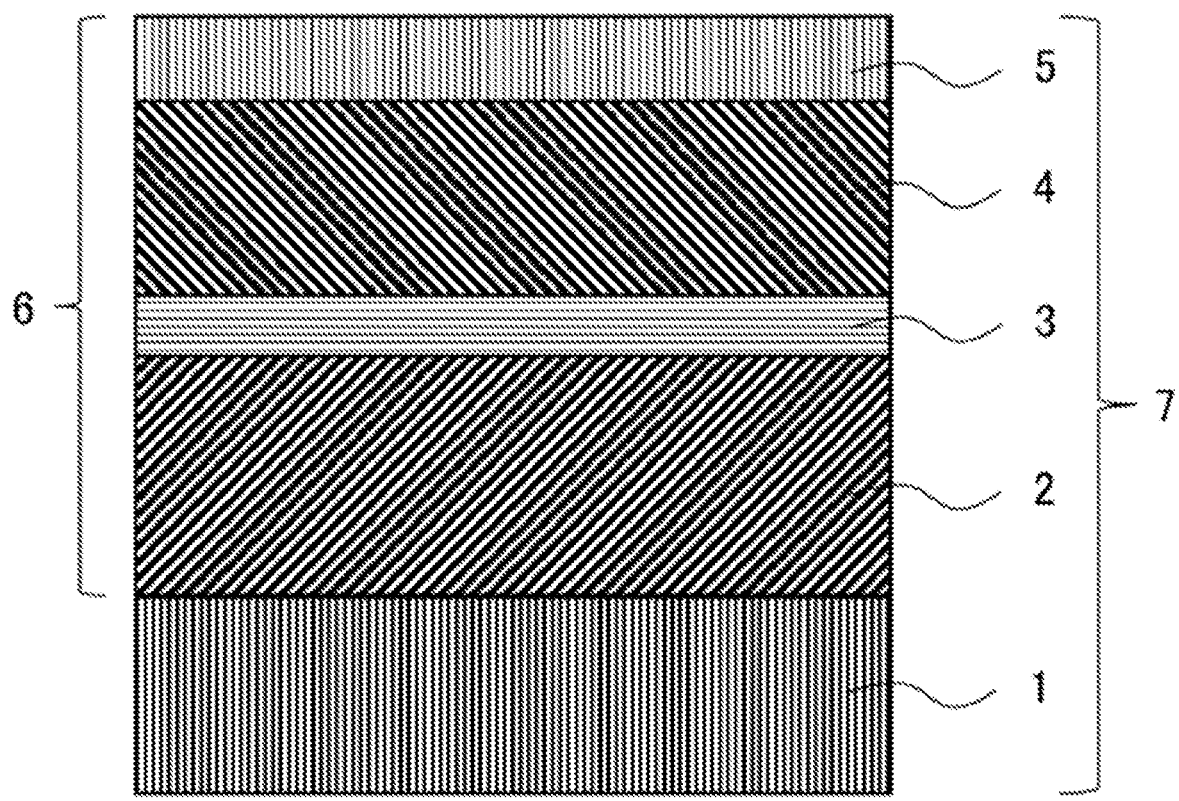

COATED CUTTING TOOL

CROSS-REFERENCES TO RELATED APPLICATIONS

This application relates to and claims priority from Japanese Patent Application No. 2020-117681 on (Jul. 8, 2020), the entire disclosure of which is incorporated herein by reference.

BACKGROUND OF THE INVENTION

Field of the Invention

The present invention relates to a coated cutting tool.

Description of Related Art

In the related art, it is well known that a coated cutting tool, in which a coating layer is vapor-deposited on a surface of a substrate made of cemented carbide by a chemical vapor deposition method and has a total thickness of 3 μm to 20 μm, is used for cutting steel, cast iron, and the like. As the above-described coating layer, there has been known, for example, a coating layer formed of one type of single layer or two or more types of multiple layers selected from the group consisting of carbides, nitrides, carbonitrides, oxycarbides, and oxycarbonitrides of Ti, and aluminum oxides.

Further, it is known that in order to improve adhesion between a Ti carbonitride layer and an aluminum oxide layer formed by the chemical vapor deposition method, a (Ti, Al) (C, N, O) layer, a Ti oxycarbonitride layer, and the like are formed.

For example, WO 2017/090765 (PTL 1) describes a cutting tool including a substrate and a coating layer located on a surface of the substrate. The coating layer includes a lower layer containing titanium nitride, an upper layer containing aluminum oxide having an α-type crystal structure, which is located above the lower layer, and an intermediate layer located between the lower layer and the upper layer. The intermediate layer includes a first layer containing $TiC_{x1}N_{y1}O_{z1}$ ($0 \leq x1 < 1$, $0 \leq y1 < 1$, $0 < z1 < 1$, $x1+y1+z1=1$) and adjacent to the lower layer, a second layer containing $TiC_{x2}N_{y2}O_{z2}$ ($0 \leq x2 < 1$, $0 \leq y2 < 1$, $0 < z2 < 1$, $x2+y2+z2=1$) and adjacent to the upper layer, and a third layer located between the first layer and the second layer and containing $TiC_{x3}N_{y3}O_{z3}$ ($0 \leq x3 < 1$, $0 \leq y3 < 1$, $0 \leq z3 < 1$, $x3+y3+z3=1$), and $z1 > z3$ and $z2 > z3$.

For example, JP-T-2014-526391 (PTL 2) describes a cutting tool insert including a substrate formed of a super-hard material such as cemented carbide, cermet, ceramics, steel or cubic boron nitride (CBN) and a coating having a total thickness of 5 μm to 40 μm. The coating includes one or more heat-resistant layers in which at least one layer is an $\alpha$-$Al_2O_3$ layer having a thickness of Σ1 μm to 20 μm. Here, a length of Σ3-type crystal grain boundaries in the at least one $\alpha$-$Al_2O_3$ layer is more than 80% of a total length of Σ3, Σ7, Σ11, Σ17, Σ19, Σ21, Σ23, and Σ29-type crystal grain boundaries (=Σ3-29-type crystal grain boundaries), and the crystal grain boundary character distribution is measured by EBSD.

In cutting processing in recent years, high speed, high feed, and deep cutting have become more remarkable, and it is required to improve wear resistance and fracture resistance of tools as compared with the tools in the related art. In particular, in high speed, high feed, and deep cutting for stainless steel, cutting processing in which a load acts on a coated cutting tool is increasing. In such harsh cutting conditions, since adhesion between an aluminum oxide layer and a Ti compound layer as a lower layer in a coating layer is insufficient for the tool in the related art, a fracture occurs due to the peeling of the aluminum oxide layer. The tool life is difficult to extend because of the above reason.

On the other hand, it is known that a TiCNO layer in PTL 1 is formed in order to improve the adhesion between the aluminum oxide layer and the Ti compound layer as the lower layer, but in stainless steel processing where processing hardening occurs, the adhesion is insufficient and there is room for improvement. Further, PTL 2 examines the length of the Σ3-type crystal grain boundaries, but does not consider crystal grain boundaries in a bond layer between a TiON layer and the $\alpha$-$Al_2O_3$ layer. Therefore, in stainless steel processing where processing hardening occurs, the adhesion is insufficient and there is room for improvement.

SUMMARY

The invention has been made in view of the above circumstances, and an object of the invention is to provide a coated cutting tool whose tool life can be extended by having excellent wear resistance and fracture resistance.

After conducting research on extending the tool life of a coated cutting tool from the above viewpoint, the inventor has found that adhesion is further improved by setting a ratio of a length of CSL grain boundaries in an intermediate layer between a lower layer containing a Ti compound layer and an upper layer containing $\alpha$-type $Al_2O_3$ to a specific range, and thereby, damage to the upper layer containing $\alpha$-type $Al_2O_3$ is prevented and an effect of the upper layer containing $\alpha$-type $Al_2O_3$ lasts longer than that in the related art, so it is possible to improve wear resistance, and as a result, the tool life of the coated cutting tool can be extended. Thus, the invention has been completed.

That is, the gist of the invention is as follows.

[1]

A coated cutting tool including:
a substrate; and
a coating layer formed on a surface of the substrate, in which
the coating layer includes a lower layer, an intermediate layer, and an upper layer in this order from a substrate side to a surface side of the coating layer,
the lower layer includes one or more Ti compound layers formed of a Ti compound containing Ti and at least one element selected from the group consisting of C, N, and B,
the intermediate layer contains TiCNO, TiCO, or TiAlCNO,
the upper layer contains $\alpha$-type $Al_2O_3$,
an average thickness of the lower layer is 2.0 μm or more and 8.0 μm or less,
an average thickness of the intermediate layer is 0.5 μm or more and 2.0 μm or less and is 10% or more and 20% or less of a thickness of the entire coating layer,
an average thickness of the upper layer is 0.8 μm or more and 6.0 μm or less, and
in the intermediate layer, a ratio of a length of CSL grain boundaries to a total length 100% of a total grain boundary is 20% or more and 60% or less.

[2]

The coated cutting tool according to [1], in which
in the intermediate layer, a ratio of a length of Σ3 grain boundaries to a total length 100% of the CSL grain boundaries is 10% or more and less than 50%.

[3]

The coated cutting tool according to [1] or [2], in which the coating layer includes an outer layer on the upper layer and on a side opposite to the substrate side, the outer layer includes a Ti compound layer formed of a Ti compound containing Ti and at least one element selected from the group consisting of C, N, and B, and an average thickness of the outer layer is 0.2 μm or more and 4.0 μm or less.

[4]

The coated cutting tool according to any one of [1] to [3], in which an average thickness of the entire coating layer is 5.0 μm or more and 20.0 μm or less.

[5]

The coated cutting tool according to any one of [1] to [4], in which the Ti compound layer included in the lower layer is at least one selected from the group consisting of a layer formed of TiN, a layer formed of TiC, a layer formed of TiCN, and a layer formed of $TiB_2$.

[6]

The coated cutting tool according to any one of [1] to [5], in which the substrate is any one of cemented carbide, cermet, ceramics, or a cubic boron nitride sintered body.

Advantageous Effects of the Invention

According to the invention, it is possible to provide a coated cutting tool whose tool life can be extended by having excellent wear resistance and fracture resistance.

BRIEF DESCRIPTION OF THE DRAWINGS

The FIGURE is a schematic view showing an example of a coated cutting tool according to the invention.

DETAILED DESCRIPTION

Hereinafter, an embodiment for implementing the invention (hereinafter, simply referred to as "the present embodiment") will be described in detail with reference to the drawings as necessary, but the invention is not limited to the following embodiment. The invention can be modified in various ways without departing from the gist thereof. Unless otherwise specified, a positional relationship such as up, down, left, and right in the drawing is based on a positional relationship shown in the drawing. Furthermore, a dimensional ratio in the drawing is not limited to a ratio shown.

A coated cutting tool of the present embodiment includes: a substrate;

and a coating layer formed on a surface of the substrate. The coating layer includes a lower layer, an intermediate layer, and an upper layer in this order from a substrate side to a surface side of the coating layer, the lower layer includes one or more Ti compound layers formed of a Ti compound containing Ti and at least one element selected from the group consisting of C, N, and B, the intermediate layer contains TiCNO (Ti carbonitride), TiCO (Ti carbide), or TiAlCNO (Ti and Al oxycarbonitride), the upper layer contains α-type $Al_2O_3$, an average thickness of the lower layer is 2.0 μm or more and 8.0 μm or less, an average thickness of the intermediate layer is 0.5 μm or more and 2.0 μm or less and is 10% or more and 20% or less of a thickness of the entire coating layer, an average thickness of the upper layer is 0.8 μm or more and 6.0 μm or less, and in the intermediate layer, a ratio of a length of CSL grain boundaries to a total length 100% of a total grain boundary is 20% or more and 60% or less.

With the above configuration, wear resistance and fracture resistance of the coated cutting tool of the present embodiment can be improved, and as a result, the tool life can be extended. Factors for improving the wear resistance and the fracture resistance of the coated cutting tool of the present embodiment are considered as follows. However, the invention is not limited to the following factors. That is, first, in the coated cutting tool of the present embodiment, the lower layer of the coating layer includes one or more Ti compound layers formed of a Ti compound containing Ti and at least one element selected from the group consisting of C, N, and B. When the coated cutting tool of the present embodiment includes such a lower layer between the substrate and the intermediate layer, the wear resistance and the adhesion are improved. Further, in the coated cutting tool of the present embodiment, when the average thickness of the lower layer is 2.0 μm or more, the wear resistance is improved, and on the other hand, when the average thickness of the lower layer is 8.0 μm or less, the fracture resistance is improved mainly due to the prevention of peeling of the coating layer.

Further, in the coated cutting tool of the present embodiment, the coating layer includes the intermediate layer containing TiCNO, TiCO, or TiAlCNO. When such an intermediate layer is formed under the upper layer containing α-type $Al_2O_3$, the adhesion is improved. Further, when the average thickness of the intermediate layer is 0.5 μm or more, a surface of the lower layer can be uniformly covered, and therefore, the adhesion is improved and a fracture caused by peeling can be prevented. On the other hand, when the average thickness of the intermediate layer is 2.0 μm or less, the occurrence of the fracture can be prevented and the fracture resistance is improved. Further, in the coated cutting tool of the present embodiment, the average thickness of the intermediate layer is 10% or more and 20% or less of the average thickness of the entire coating layer. When the average thickness of the intermediate layer is 10% or more of the average thickness of the entire coating layer, the ratio of the length of the CSL grain boundaries is increased, and therefore, the adhesion is further improved and the fracture resistance is excellent. Further, when the average thickness of the intermediate layer is 10% or more of the average thickness of the entire coating layer, the fracture resistance is improved by reducing a ratio of a layer such as the lower layer or the upper layer having hardness higher than that of the intermediate layer. On the other hand, when the average thickness of the intermediate layer is 20% or less of the average thickness of the entire coating layer, the occurrence of the fracture can be prevented by preventing a decrease in strength of the coating layer. Further, in the coated cutting tool of the present embodiment, in the intermediate layer, the ratio of the length of the CSL grain boundaries to the total length 100% of the total grain boundary is 20% or more and 60% or less. In the intermediate layer, when the ratio of the length of the CSL grain boundaries to the total length 100% of the total grain boundary is 20% or more, a ratio of grain boundaries having relatively low grain boundary energy increases, and therefore, mechanical properties of the intermediate layer are improved. On the other hand, in the intermediate layer, when the ratio of the length of the CSL grain boundaries to the total length 100% of the total grain boundary is 60% or less, coarse graining of crystal grains can be prevented, and therefore, chipping resistance is excellent. In the present embodiment, the total length of the total grain boundary is a sum of the length of the CSL grain boundaries and a length of other general crystal grain boundaries.

Further, in the coated cutting tool of the present embodiment, the average thickness of the upper layer containing α-type $Al_2O_3$ is 0.8 μm or more and 6.0 μm or less. When the average thickness of the upper layer containing α-type $Al_2O_3$ is 0.8 μm or more, crater wear resistance on a rake face of the coated cutting tool is further improved. When the average thickness of the upper layer containing α-type $Al_2O_3$ is 6.0 μm or less, the peeling of the coating layer is further prevented, and the fracture resistance of the coated cutting tool tends to be further improved.

Then, by combining these configurations, it is considered that the wear resistance and the fracture resistance of the coated cutting tool of the present embodiment are improved, and as a result, the tool life can be extended.

The FIGURE is a schematic cross-sectional view showing an example of the coated cutting tool according to the present embodiment. A coated cutting tool 7 includes a substrate 1 and a coating layer 6 formed on a surface of the substrate 1, and in the coating layer 6, a lower layer 2, an intermediate layer 3, an upper layer 4, and an outer layer 5 are laminated in this order in an upward direction (from the substrate side to the surface side of the coating layer).

The coated cutting tool of the present embodiment includes a substrate and a coating layer formed on the surface of the substrate. Specific examples of types of the coated cutting tool include an indexable cutting insert for milling or turning, a drill, and an end mill.

The substrate used in the present embodiment is not particularly limited as long as the substrate can be used as a substrate for a coated cutting tool. Examples of such a substrate include cemented carbide, cermet, ceramics, a cubic boron nitride sintered body, a diamond sintered body, and high speed steel. Among the above, it is preferable the substrate is any one of cemented carbide, cermet, ceramics, and a cubic boron nitride sintered body because the coated cutting tool is more excellent in the wear resistance and the fracture resistance, and from the same viewpoint, it is more preferable that the substrate is cemented carbide.

The surface of the substrate may be modified. For example, when the substrate is made of cemented carbide, a β-free layer may be formed on the surface thereof. Further, when the substrate is made of cermet, a cured layer may be formed on the surface thereof. Even if the surface of the substrate is modified as described above, the effects of the invention can be achieved.

The coating layer used in the present embodiment preferably has an average thickness of 5.0 μm or more and 20.0 μm or less, and therefore, the wear resistance is improved. In the coated cutting tool of the present embodiment, when the average thickness of the entire coating layer is 5.0 μm or ore, the wear resistance is improved, and when the average thickness of the entire coating layer is 20.0 μm or less, the fracture resistance is improved mainly due to the prevention of peeling of the coating layer. In particular, in stainless steel processing, the coating layer is likely to be peeled off due to a work material being welded to the coated cutting tool and then separated (peeled). In order to prevent the peeling, it is more preferable that the average thickness of the entire coating layer is 12.2 μm or less. The average thickness of each layer or the entire coating layer in the coated cutting tool of the present embodiment is obtained by measuring the thickness of each layer or the thickness of the entire coating layer from three or more cross sections in each layer or the entire coating layer, and calculating an arithmetic mean value

[Lower Layer]

The lower layer used in the present embodiment includes one or more Ti compound layers formed of a Ti compound containing Ti and at least one element selected from the group consisting of C, N, and B. When the coated cutting tool of the present embodiment includes such a lower layer between the substrate and the intermediate layer, the wear resistance and the adhesion are improved.

Examples of the Ti compound layer include a TiC layer formed of TiC, a TiN layer formed of TiN, a TiCN layer formed of TiCN, and a $TiB_2$ layer formed of $TiB_2$.

The lower layer may include one layer or multiple layers (for example, two or three layers), and preferably includes multiple layers, more preferably includes two or three layers, and still more preferably includes two layers. The lower layer preferably includes at least one layer selected from the group consisting of a TiN layer, a TiC layer, a TiCN layer, and a $TiB_2$ layer from the viewpoint of further improving the wear resistance and the adhesion. Further, in the coated cutting tool of the present embodiment, when at least one layer of the lower layer is a TiCN layer, the wear resistance tends to be further improved.

Further, in the coated cutting tool of the present embodiment, when at least one layer of the lower layer is a TiN layer, and the TiN layer is formed on the surface of the substrate, the adhesion tends to be further improved. When the lower layer includes two layers, a TiC layer or a TiN layer may be formed as a first layer on the surface of the substrate, and a TiCN layer may be formed as a second layer on the surface of the first layer. Among the above, the lower layer may be formed with a TiN layer as the first layer on the surface of the substrate and formed with a TiCN layer as the second layer on the surface of the first layer.

The average thickness of the lower layer used in the present embodiment is 2.0 μm or more and 8.0 μm or less. In the coated cutting tool of the present embodiment, when the average thickness of the lower layer is 2.0 μm or more, the wear resistance is improved. On the other hand, in the coated cutting tool of the present embodiment, when the average thickness of the lower layer is 8.0 μm or less, the fracture resistance is improved mainly due to the prevention of the peeling of the coating layer. From the same viewpoint, the average thickness of the lower layer is preferably 2.5 μm or ore and 7.0 μm or less, and more preferably 3.0 μm or more and 6.0 μm or less.

The average thickness of the TiC layer or the TiN layer is preferably 0.05 μm or more and 1.0 μm or less from the viewpoint of further improving the wear resistance and the fracture resistance. From the same viewpoint, the average thickness of the TiC layer or the TiN layer is more preferably 0.1 μm or more and 0.5 μm or less, and still more preferably 0.1 μm or more and 0.3 μm or less.

The average thickness of the TiCN layer is preferably 1.5 μm or more and 8.0 μm or less from the viewpoint of further improving the wear resistance and the fracture resistance. From the same viewpoint, the average thickness of the TiCN layer is more preferably 1.6 μm or more and 7.9 μm or less, and still more preferably 1.8 μm or more and 7.8 μm or less.

The Ti compound layer is a layer formed of a Ti compound containing
Ti and at least one element selected from the group consisting of C, N, and B, and may contain a small amount of components other than the above elements as long as the Ti compound layer achieves the effects of the lower layer.

[Intermediate Layer]

The intermediate layer used in the present embodiment contains TiCNO, TiCO, or TiAlCNO, The intermediate layer is preferably a TiCNO layer formed of TiCNO, a TiCO layer formed of TiCO, or a TiAlCNO layer formed of TiAlCNO, and is preferably a TiCNO layer or a TiCO layer. When such an intermediate layer is formed so as to be in contact with the upper layer containing α-type $Al_2O_3$, the adhesion is further improved.

The average thickness of the intermediate layer used in the present embodiment is 0.5 μm or more and 2.0 μm or less. When the average thickness of the intermediate layer is 0.5 μm or more, the surface of the lower layer can be uniformly covered, and therefore, the adhesion is improved and the fracture caused by peeling can be prevented. On the other hand, when the average thickness of the intermediate layer 2.0 μm or less, the occurrence of the fracture can be prevented and the fracture resistance is improved. From the same viewpoint, the average thickness of the intermediate layer is preferably 0.8 μm or more and 1.8 μm or less.

Further, in the coated cutting tool of the present embodiment, the average thickness of the intermediate layer is 10% or more and 20% or less of the average thickness of the entire coating layer. When the average thickness of the intermediate layer is 10% or more of the average thickness of the entire coating layer, the ratio of the length of the CSL grain boundaries is increased, and therefore, the adhesion is further improved and the fracture resistance is excellent. Further, when the average thickness of the intermediate layer is 10% or more of the average thickness of the entire coating layer, the fracture resistance is improved by reducing a ratio of a layer such as the lower layer or the upper layer that tends to have hardness higher than that of the intermediate layer. On the other hand, when the average thickness of the intermediate layer is 20% or less of the average thickness of the entire coating layer, the occurrence of the fracture can be prevented by preventing a decrease in strength of the coating layer. From the same viewpoint, the average thickness of the intermediate layer is preferably 19.5% or less of the average thickness of the entire coating layer.

Further, in the coated cutting tool of the present embodiment, in the intermediate layer, the ratio of the length of the CSL grain boundaries to the total length 100% of the total grain boundary is 20% or more and 60% or less. In the intermediate layer, when the ratio of the length of the CSL grain boundaries to the total length 100% of the total grain boundary is 20% or more, a ratio of grain boundaries having relatively low grain boundary energy increases, and therefore, the mechanical properties of the intermediate layer are improved. On the other hand, in the intermediate layer, when the ratio of the length of the CSL grain boundaries to the total length 100% of the total grain boundary is 60% or less, coarse graining of crystal grains can be prevented, and therefore, the chipping resistance is excellent. In the present embodiment, the total length of the total grain boundary is a total length of the length of the CSL grain boundaries and the length of the other general crystal grain boundaries. From the same viewpoint, in the intermediate layer, the ratio of the length of the CSL grain boundaries to the total length 100% of the total grain boundary is preferably 22% or more and 58% or less, and more preferably 24% or more and 56% or less.

Further, in the coated cutting tool of the present embodiment, in the intermediate layer, a ratio of a length of Σ3 grain boundaries to the total length 100% of the CSL grain boundaries is preferably less than 50% from the viewpoint of the chipping resistance, and is preferably 50% or more from the viewpoint of the wear resistance. In the intermediate layer, when the ratio of the length of the Σ3 grain boundaries to the total length 100% of the CSL grain boundaries is less than 50%, coarse graining of crystal grains can be further prevented, and therefore, the chipping resistance tends to be further excellent. In the intermediate layer, production is easy when the ratio of the length of the Σ3 grain boundaries to the total length 100% of the CSL grain boundaries is 10% or more. From the same viewpoint, in the intermediate layer, the ratio of the length of the Σ3 grain boundaries to the total length 100% of the CSL grain boundaries is more preferably 15% or more and 48% or less, and still more preferably 16% or more and 47% or less. On the other hand, in the intermediate layer, when the ratio of the length of the Σ3 grain boundaries to the total length 100% of the CSL grain boundaries is 50% or more, a ratio of crystal grain boundaries having relatively low grain boundary energy increases and the mechanical properties are improved, and therefore, the crater wear resistance tends to be further improved. The production is easy when the ratio of the length of the Σ3 grain boundaries to the total length 100% of the CSL grain boundaries is 90% or less. From the same viewpoint, in the intermediate layer, the ratio of the length of the Σ3 grain boundaries to the total length 100% of the CSL grain boundaries is preferably 54% or more and 90% or less, more preferably 60% or more and 90% or less, and still more preferably 60% or more and 86% or less.

The intermediate layer used in the present embodiment has crystal grain boundaries having relatively high grain boundary energy and crystal grain boundaries having relatively low grain boundary energy. Normally, since the arrangement of atoms is irregularly disordered and randomly arranged, the crystal grain boundaries have relatively high grain boundary energy with many gaps. On the other hand, some crystal grain boundaries have regular arrangement of atoms and few gaps, and such crystal grain boundaries have relatively low grain boundary energy. A typical example of a crystal grain boundary having such relatively low grain boundary energy is a coincidence site lattice crystal grain boundary (hereinafter, referred to as a "CSL crystal grain boundary" and also referred to as a "CSL grain boundary"). Crystal grain boundaries have a significant effect on important sintering processes such as densification, creep, and diffusion, as well as on electrical, optical, and mechanical properties. The importance of crystal grain boundaries depends on several factors, such as a crystal grain boundary density in a material, a chemical composition at an interface, and a crystallographic texture, that is, a crystal grain boundary plane orientation and a crystal grain misorientation. The CSL crystal grain boundaries play a special role. An Σ value is known as an index showing a degree of distribution of the CSL crystal grain boundaries, and is defined as a ratio of a crystal lattice point density of two crystal grains that are in contact with each other at a crystal grain boundary to a density of matching lattice points when both crystal lattices are overlapped. For simple structures, it is generally accepted that grain boundaries having a low Σ value tend to have low interfacial energy and special properties. Therefore, controlling of a ratio of the CSL crystal grain boundaries and distribution of crystal grain misorientations is considered to be important for the properties of the intermediate layer and improvement thereof.

In recent years, SEM-based technology known as EBSD has been used to study crystal grain boundaries in a material. EBSD is based on automatic analysis of Kikuchi diffraction patterns generated by backscattered electrons.

For each crystal grain of a target material, a crystallographic orientation is determined after indexing the corresponding diffraction pattern. By using EBSD together with commercially available software, tissue analysis and determination of grain boundary character distribution (GBCD) can be performed relatively easily. By measuring and analyzing the interface using EBSD, it is possible to clarify the misorientations of the crystal grain boundaries in a sample population having a large interface. Usually, the distribution of the misorientations is related to the treatment and/or physical properties of the material. The misorientations of the crystal grain boundaries are obtained from normal orientation parameters such as an Euler angle, an angle/axis pair, or a Rodriguez vector.

The CSL crystal grain boundaries of the intermediate layer usually include grain boundaries such as Σ5 grain boundaries, Σ7 grain boundaries, Σ9 grain boundaries, Σ11 grain boundaries, Σ13 grain boundaries, Σ15 grain boundaries, Σ17 grain boundaries, Σ19 grain boundaries, Σ21 grain boundaries, Σ23 grain boundaries, Σ25 grain boundaries, Σ27 grain boundaries, and Σ29 grain boundaries in addition to the Σ3 grain boundaries. The Σ3 grain boundaries are considered to have the lowest grain boundary energy among the CSL crystal grain boundaries of the intermediate layer. Here, the length of the Σ3 grain boundaries indicates the total length of the Σ3 grain boundaries in a field of view (specific region) observed by an SEM equipped with EBSD. The Σ3 grain boundaries have a higher coincidence site lattice point density and lower grain boundary energy than those of other CSL crystal grain boundaries. In other words, the Σ3 grain boundaries are CSL crystal grain boundaries having many matching lattice points, and two crystal grains having the Σ3 grain boundaries as the grain boundaries behave like single crystals or twin crystals, and the crystal grains tend to be large. Then, as the crystal grains are larger, coating properties such as chipping resistance tend to deteriorate.

Here, the total grain boundary is a sum of the CSL crystal grain boundaries and the crystal grain boundaries other than the CSL crystal grain boundaries. Hereinafter, the crystal grain boundaries other than the CSL crystal grain boundaries are referred to as "general crystal grain boundaries". The general crystal grain boundaries are remaining grain boundaries excluding the CSL crystal grain boundaries from the total grain boundary of the crystal grains in the intermediate layer when observed with an SEM equipped with EBSD. Therefore, the "total length of the total grain boundary" can be expressed as the "sum of the length of the CSL crystal grain boundaries and the length of the general crystal grain boundaries".

In the present embodiment, the ratio of the length of the CSL grain boundaries to the total length 100% of the total grain boundary in the intermediate layer and the ratio of the length of the Σ3 grain boundaries to the total length 100% of the CSL grain boundaries can be calculated as follows.

In the coated cutting tool, a cross section of the intermediate layer is exposed in a direction perpendicular to the surface of the substrate to obtain an observation surface. Examples of a method for exposing the cross section of the intermediate layer include cutting and polishing. Of these, polishing is preferred from the viewpoint of making the observation surface of the intermediate layer smoother. In particular, the observation surface is preferably a mirror surface from the viewpoint of being smoother. A method for obtaining a mirror observation surface of the intermediate layer is not particularly limited, and examples thereof include a method of polishing using diamond paste or colloidal silica, ion milling, and the like.

Then, the above observation surface is observed by an SEM equipped with EBSD. As the observation region, it is preferable to observe a flat surface (a flank and the like).

As the SEM, SU6600 (manufactured by Hitachi High-Tech Corporation) equipped with EBSD (manufactured by TexSEM Laboratories Inc.) is used.

The normal of the observation surface is tilted 70° with respect to an incident beam, and the analysis is performed by emitting an electron beam with an acceleration voltage of 15 kV and an irradiation current of 1.0 nA. Data collection is performed in steps of 0.1 μm/step for a point corresponding to a surface region having a length of 80% of the thickness of the intermediate layer×10 μm ((a length of 80% of the thickness of the intermediate layer (μm)×10)×100) on the observation surface. The data collection is performed for the surface region at 5 fields of view (a length of 80% of the thickness of the intermediate layer×10 μm), and an average value is calculated.

Data processing is performed using commercially available software. The CSL crystal grain boundaries corresponding to any Σ value are counted, and can be confirmed by expressing a ratio of each type of grain boundary as the ratio to the total crystal grain boundary. From the above, the length of the Σ3 grain boundaries, the length of the CSL grain boundaries, and the total length of the total grain boundary are obtained, and the ratio of the length of the CSL grain boundaries to the total length 100% of the total grain boundary and the ratio of the length of the Σ3 grain boundaries to the total length 100% of the CSL grain boundaries can be calculated.

In the present embodiment, the intermediate layer may contain TiCNO, TiCO, or TiAlCNO, and may or may not contain components other than TiCNO, TiCO, or TiAlCNO as long as the effects of the invention are achieved.

[Upper Layer]

The upper layer used in the present embodiment contains α-type $Al_2O_3$. In the coated cutting tool of the present embodiment, since the upper layer contains α-type $Al_2O_3$, the coated cutting tool becomes hard, and therefore, the wear resistance is improved. Further, in the coated cutting tool of the present embodiment, the upper layer containing α-type $Al_2O_3$ is provided on the intermediate layer and on the side opposite to the substrate side. In the coated cutting tool of the present embodiment, since the upper layer containing α-type $Al_2O_3$ is provided on the intermediate layer containing TiCNO, TiCO or TiAlCNO and on the side opposite to the substrate side, the adhesion of the entire coating layer is improved. Accordingly, in the coated cutting tool of the present embodiment, the fracture caused by peeling can be prevented in particular.

Further, in the coated cutting tool of the present embodiment, the average thickness of the upper layer containing α-type $Al_2O_3$ is 0.8 μm or more and 6.0 μm or less. When the average thickness of the upper layer containing α-type $Al_2O_3$ is 0.8 μm or more, the crater wear resistance on the rake face of the coated cutting tool is further improved. When the average thickness of the upper layer containing α-type $Al_2O_3$ is 6.0 μm or less, the peeling of the coating layer is further prevented, and the fracture resistance of the coated cutting tool tends to be further improved. From the same viewpoint, the average thickness of the upper layer is preferably 1.0 μm or more and 6.0 μm or less, and more preferably 2.0 μm or more and 4.0 μm or less.

In the present embodiment, the intermediate layer may contain α-type aluminum oxide (α-type $Al_2O_3$), and may or may not contain components other than α-type aluminum oxide (α-type $Al_2O_3$) as long as the effects of the invention are achieved.

[Outer Layer]

In the coated cutting tool of the present embodiment, it is preferable that the coating layer includes an outer layer provided on the upper layer and on the side opposite to the substrate side.

The outer layer used in the present embodiment preferably includes a Ti compound layer formed of a Ti compound containing Ti and at least one element selected from the group consisting of C, N, and B. Examples of the Ti compound layer include a TiC layer formed of TiC, a TiN layer formed of TiN, a TiCN layer formed of TiCN, and a $TiB_2$ layer formed of $TiB_2$.

Of these, the outer layer used in the present embodiment preferably includes a Ti compound layer such as a TiN layer or a TiCN layer. In the coated cutting tool of the present embodiment, since the outer layer includes a Ti compound layer such as a TiN layer or a TiCN layer, a used corner tends to be easily identified.

The average thickness of the outer layer used in the present embodiment is preferably 0.2 μm or more and 4.0 μm or less, and more preferably 0.3 μm or more and 3.0 μm or less. When the average thickness of the outer layer is equal to or more than the lower limit value, the effect of having the outer layer can be more effectively and surely obtained, and when the average thickness of the outer layer is equal to or less than the upper limit value, the fracture resistance of the coated cutting tool tends to be further improved mainly due to the fact that the peeling of the coating layer is further prevented.

In the present embodiment, the outer layer may or may not contain components other than the Ti compound such as TiN and TiCN as long as the effects of the invention are achieved.

In the coated cutting tool of the present embodiment, each layer forming the coating layer may be formed by a chemical vapor deposition method or a physical vapor deposition method. Specific examples of a method for forming each layer include the following methods. However, the method of forming each layer is not limited thereto.

(Chemical Vapor Deposition Method)

(Lower layer Forming Step)

As the lower layer, for example, a Ti compound layer formed of a Ti compound containing Ti and at least one element selected from the group consisting of C, N, and B can be formed as follows.

For example, when the Ti compound layer is a Ti nitride layer (hereinafter, also referred to as a "TiN layer"), the Ti compound layer can be formed by a chemical vapor deposition method in which a raw material composition is set to $TiCl_4$: 5.0 mol % to 10.0 mol %, $N_2$: 20 mol % to 60 mol %, and $H_2$: balance, the temperature is set to 850° C. to 950° C., and the pressure is set to 300 hPa to 400 hPa.

When the Ti compound layer is a Ti carbide layer (hereinafter, also referred to as a "TiC layer"), the Ti compound layer can be formed by a chemical vapor deposition method in which a raw material composition is set to $TiCl_4$: 1.5 mol % to 3.5 mol %, $CH_4$: 3.5 mol % to 5.5 mol %, $H_2$: balance, the temperature is set to 950° C. to 1050° C., and the pressure is set to 70 hPa to 80 hPa.

When the Ti compound layer is a Ti carbonitride layer (hereinafter, also referred to as a "TiCN layer"), the Ti compound layer can be formed by a chemical vapor deposition method in which a raw material composition is set to $TiCl_4$: 5.0 mol % to 7.0 mol %, $CH_3CN$: 0.5 mol % to 1.5 mol %, $H_2$: balance, the temperature is set to 800° C. to 900° C., and the pressure is set to 60 hPa to 80 hPa (Intermediate Layer Forming Step)

As the intermediate layer, for example, a compound layer formed of TiCNO, TiCO, or TiAlCNO can be formed as follows.

When the compound layer is a Ti oxycarbonitride layer (hereinafter, also referred to as a "TiCNO layer"), the compound layer can be formed by a chemical vapor deposition method in which a raw material composition is set to $TiCl_4$: 0.5 mol % to 2.5 mol %, CO: 0.5 mol % to 1.5 mol %, $N_2$: 20 mol % to 60 mol%, HCl: 2.0 mol % to 5.0 mol %, $H_2$: balance, the temperature is set to 950° C. to 1050° C., and the pressure is set to 50 hPa to 200 hPa.

When the compound layer is a Ti oxycarbide layer (hereinafter, also referred to as a "TiCO layer"), the compound layer can be formed by a chemical vapor deposition method in which a raw material composition is set to $TiCl_4$: 0.5 mol % to 2.0 mol %, CO: 0.5 mol % to 1.5 mol %, HCl: 2.0 mol % to 4.0 mol %, $H_2$: balance, the temperature is set to 950° C. to 1050° C., and the pressure is set to 50 hPa to 150 hPa, When the compound layer is a Ti and Al oxycarbonitride layer (hereinafter, also referred to as a "TiAlCNO layer"), the compound layer can be formed by a chemical vapor deposition method in which a raw material composition is set to $TiCl_4$: 0.5 mol % to 2.0 mol %, CO: 0.5 mol % to 1.5 mol %, $AlCl_3$: 1.0 mol % to 3.0 mol %, $N_2$: 20 mol % to 60 mol %, HCl: 3.0 mol % to 5.0 mol %, $H_2$: balance, the temperature is set to 950° C. to 1050° C., and the pressure is set to 50 hPa to 150 hPa.

In the intermediate layer, in order to set the ratio of the length of the CSL grain boundaries to the total length 100% of the total grain boundary within the above-described specific range, in an intermediate layer forming step, the pressure may be controlled, the average thickness of the intermediate layer may be controlled, a ratio of $H_2$ in the raw material composition may be controlled, or HCl may be introduced. More specifically, the ratio of the length of the CSL grain boundaries in the intermediate layer can be increased by lowering the pressure or increasing the ratio of $H_2$ in the raw material composition in the intermediate layer forming step. Further, by increasing the average thickness of the intermediate layer, the ratio of the length of the CSL grain boundaries in the intermediate layer can be increased. Further, by introducing HCl in the intermediate layer forming step, the ratio of the length of the CSL grain boundaries in the intermediate layer can be set to be equal to or less than the upper limit value of the above-described specific range.

Further, in the intermediate layer, in order to set the ratio of the length of the Σ3 grain boundaries to the total length 100% of the CSL grain boundaries within the above-described specific range, in the intermediate layer forming step, the pressure may be controlled, the average thickness of the intermediate layer may be controlled, or a ratio of $TiCl_4$ in the raw material composition may be controlled. More specifically, the ratio of the length of the Σ3 grain boundaries in the intermediate layer can be increased by lowering the pressure or increasing the ratio of $TiCl_4$ in the raw material composition in the intermediate layer forming step. Further, by increasing the average thickness of the intermediate layer, the ratio of the length of the Σ3 grain boundaries in the intermediate layer can be reduced.

(Upper Layer Forming Step)

As the upper layer, for example, an α-type $Al_2O_3$ layer formed of α-type $Al_2O_3$ (hereinafter, also simply referred to as an "$Al_2O_3$ layer") can be formed as follows.

First, the lower layer including one or more Ti compound layers is formed on the surface of the substrate. Then, the intermediate layer containing TiCNO, TiCO, or TiAlCNO is formed. Of those layers, a surface of a layer farthest from the substrate is oxidized. Then, the upper layer containing the α-type $Al_2O_3$ layer is formed on the surface of the layer away from the substrate.

More specifically, the oxidation of the surface of the layer farthest from the substrate is performed under conditions that a gas composition is set to $CO_2$: 0.3 mol % to 1.0 mol %, $H_2$: balance, the temperature is set to 950° C. to 1050° C., and the pressure is set to 50 hPa to 70 hPa (oxidation step). The oxidation treatment time at this time is preferably 1 to 10 minutes.

Then, the α-type $Al_2O_3$ layer is formed by a chemical vapor deposition method in which a raw material gas composition is set to $AlCl_3$: 2.0 mol % to 5.0 mol %, $CO_2$: 2.5 mol % to 4.0 mol %, HCl: 2.0 mol % to 3.0 mol %, $H_2S$: 0.30 mol % to 0.40 mol %, $H_2$: balance, the temperature is set to 950° C. to 1050° C., and the pressure is set to 60 hPa to 80 hPa (film forming step).

(Outer Layer Forming Step)

Further, the outer layer including a Ti nitride layer (hereinafter, also referred to as a "TiN layer") or a Ti carbonitride layer (hereinafter, also referred to as a "TiCN layer") may be formed on a surface of the upper layer.

The TiN layer as the outer layer can be formed by a chemical vapor deposition method in which a raw material composition is set to $TiCl_4$: 7.0 mol % to 8.0 mol %, $N_2$: 30 mol % to 50 mol %, $H_2$: balance, the temperature is set to 950° C. to 1050° C., and the pressure is set to 300 hPa to 400 hPa.

The TiCN layer as the outer layer can be formed by a chemical vapor deposition method in which a raw material composition is set to $TiCl_4$: 7.0 mol % to 9.0 mol %, $CH_3CN$: 0.7 mol % to 2.0 mol %, $CH_4$: 1.0 mol % to 2.0 mol %, $N_2$: 4.0 mol % to 6.0 mol %, $H_2$: balance, the temperature is set to 950° C. to 1050° C., and the pressure is set to 60 hPa to 80 hPa.

The thickness of each layer in the coating layer of the coated cutting tool of the present embodiment can be measured by observing a cross-sectional structure of the coated cutting tool using an optical microscope, a scanning electron microscope (SEM), a field emission scanning electron microscope (FE-SEM), and the like. The average thickness of each layer in the coated cutting tool of the present embodiment can be obtained as the arithmetic mean value by measuring the thickness of each layer at three or more points in the vicinity of a position 50 μm from a cutting edge ridgeline portion toward a center portion of the rake face of the coated cutting tool. Further, the composition of each layer in the coating layer of the coated cutting tool of the present embodiment can be measured from the cross-sectional structure of the coated cutting tool by using an energy dispersive X-ray spectroscope (EDS), a wavelength dispersive X-ray spectroscope (WDS), and the like.

It is considered that the coated cutting tool of the present embodiment has an effect that the tool life can be extended as compared with that in the related art because the coated cutting tool has excellent fracture resistance and wear resistance. However, factors that can extend the tool life are not limited to the above.

EXAMPLES

Hereinafter, the invention will be described in more detail by way of Examples, but the invention is not limited to these Examples.

As a substrate, cemented carbide was processed into an insert shape of CNMG120408, so as to prepare cemented carbide having a composition of 89.2WC-8.80Co-2.0NbC (or more mass %). A cutting edge ridgeline portion of the substrate was subjected to round honing with a SiC brush, and then a surface of the substrate was washed.

[Invention Products 1 to 16 and Comparative Products 1 to 11]

After washing the surface of the substrate, a coating layer was formed by a chemical vapor deposition method. First, the substrate was charged into an external thermal chemical vapor deposition device, and under conditions of the raw material gas composition, the temperature, and the pressure shown in Table 1, a lower layer having a composition shown in Table 2 was formed on the surface of the substrate in the order of a first layer and a second layer so as to have an average thickness shown in Table 2. Then, under conditions of a raw material gas composition, a temperature, and a pressure shown in Table 3, an intermediate layer having a composition shown in Table 2 was formed on a surface of the second layer of the lower layer so as to have the average thickness shown in Table 2. Then, a surface of the intermediate layer was oxidized for 5 minutes under conditions of a gas composition of $CO_2$: 0.5 mol %, $H_2$: 99.5 mol %, a temperature of 1000° C., and a pressure of 60 hPa. Then, under conditions of a raw material gas composition, a temperature, and a pressure shown in Table 1 an upper layer formed of α-type aluminum oxide was formed on the surface of the intermediate layer after being oxidized so as to have an average thickness shown in Table 2. Finally, under conditions of a raw material gas composition, a temperature, and a pressure shown in Table 1, an outer layer having a composition shown in Table 2 was formed on a surface of the upper layer so as to have an average thickness shown in Table 2. Therefore, coated cutting tools of Invention Products 1 to 16 and Comparative Products 1 to 11 were obtained.

TABLE 1

| | Composition of each layer | Temperature (° C.) | Pressure (hPa) | Raw material composition (mol %) |
|---|---|---|---|---|
| Lower layer | TiN (first layer) | 900 | 350 | $TiCl_4$: 7.5%, $N_2$: 40.0%, $H_2$: 52.5% |
| | TiC (first layer) | 1000 | 75 | $TiCl_4$: 2.4%, $CH_4$: 4.6%, $H_2$: 93.0% |
| | TiCN (second layer) | 850 | 70 | $TiCl_4$: 6.0%, $CH_3CN$: 1.0%, $H_2$: 93.0% |
| Upper layer | α-type $Al_2O_3$ | 1000 | 70 | $AlCl_3$: 2.5%, $CO_2$: 3.0%, HCl: 2.3%, $H_2S$: 0.35%, $H_2$: 91.85% |
| Outer layer | TiN | 1000 | 350 | $TiCl_4$: 7.5%, $N_2$: 40.0%, $H_2$: 52.5% |
| | TiCN | 1000 | 70 | $TiCl_4$: 8.0%, $CH_3CN$: 1.0%, $CH_4$: 1.5%, $N_2$: 5.0%, $H_2$: 84.5% |

TABLE 2

| | Coating layer | | | | | | | | | | | |
|---|---|---|---|---|---|---|---|---|---|---|---|---|
| | Lower layer (Ti Compound layer) | | | | Intermediate layer | | Upper layer | | Outer layer | | Average thickness of entire coating layer (μm) | Ratio of average thickness of intermediate layer to entire coating (%) |
| | First layer | | Second layer | | Average thickness of entire (μm) | | | | | | | |
| | Composition | Average thickness (μm) | Composition | Average thickness (μm) | | Composition | Average thickness (μm) | Crystal system | Composition | Average thickness (μm) | Composition | Average thickness (μm) | | |
| Invention Product 1 | TiN | 0.2 | TiCN | 3.0 | 3.2 | TiCNO | 1.0 | α | Al₂O₃ | 3.2 | TiN | 0.5 | 7.9 | 12.7 |
| Invention Product 2 | TiN | 0.2 | TiCN | 3.0 | 3.2 | TiCNO | 0.8 | α | Al₂O₃ | 3.2 | TiN | 0.5 | 7.7 | 10.4 |
| Invention Product 3 | TiN | 0.2 | TiCN | 3.0 | 3.2 | TiCNO | 1.6 | α | Al₂O₃ | 3.2 | TiN | 0.2 | 8.2 | 19.5 |
| Invention Product 4 | TiN | 0.2 | TiCN | 2.0 | 2.2 | TiCNO | 0.5 | α | Al₂O₃ | 2.0 | TiN | 0.3 | 5.0 | 10.0 |
| Invention Product 5 | TiN | 0.2 | TiCN | 3.0 | 3.2 | TiCNO | 2.0 | α | Al₂O₃ | 4.0 | TiN | 3.0 | 12.2 | 16.4 |
| Invention Product 6 | TiN | 0.2 | TiCN | 3.0 | 3.2 | TiCNO | 1.0 | α | Al₂O₃ | 3.2 | TiN | 0.5 | 7.9 | 12.7 |
| Invention Product 7 | TiN | 0.2 | TiCN | 3.0 | 3.2 | TiCNO | 1.0 | α | Al₂O₃ | 3.2 | TiN | 0.5 | 7.9 | 12.7 |
| Invention Product 8 | TiN | 0.2 | TiCN | 1.8 | 2.0 | TiCNO | 1.0 | α | Al₂O₃ | 4.0 | TiCN | 1.0 | 8.0 | 12.5 |
| Invention Product 9 | TiN | 0.2 | TiCN | 7.8 | 8.0 | TiCNO | 1.5 | α | Al₂O₃ | 2.0 | TiCN | 0.5 | 12.0 | 12.5 |
| Invention Product 10 | TiN | 0.2 | TiCN | 5.0 | 5.2 | TiCNO | 1.0 | α | Al₂O₃ | 1.0 | TiCN | 0.5 | 7.7 | 13.0 |
| Invention Product 11 | TiN | 0.2 | TiCN | 3.8 | 4.0 | TiCNO | 1.5 | α | Al₂O₃ | 6.0 | TiCN | 0.5 | 12.0 | 12.5 |
| Invention Product 12 | TiN | 0.2 | TiCN | 5.0 | 5.2 | TiCNO | 1.5 | α | Al₂O₃ | 3.0 | TiCN | 0.5 | 10.2 | 14.7 |
| Invention Product 13 | TiN | 0.2 | TiCN | 5.0 | 5.2 | TiCNO | 1.0 | α | Al₂O₃ | 3.0 | TiCN | 0.5 | 9.7 | 10.3 |
| Invention Product 14 | TiN | 0.2 | TiCN | 5.0 | 5.2 | TiCO | 1.5 | α | Al₂O₃ | 3.0 | TiCN | 0.5 | 10.2 | 14.7 |
| Invention Product 15 | TiN | 0.2 | TiCN | 5.0 | 5.2 | TiAlCNO | 1.5 | α | Al₂O₃ | 3.0 | TiCN | 0.5 | 10.2 | 14.7 |
| Invention Product 16 | TiC | 0.2 | TiCN | 3.0 | 3.2 | TiCNO | 1.0 | α | Al₂O₃ | 3.2 | TiN | 0.5 | 7.9 | 12.7 |
| Comparative Product 1 | TiN | 0.2 | TiCN | 3.0 | 3.2 | TiCNO | 0.5 | α | Al₂O₃ | 32 | TiN | 1.0 | 7.9 | 6.3 |
| Comparative Product 2 | TiN | 0.2 | TiCN | 2.8 | 3.0 | TiCNO | 2.0 | α | Al₂O₃ | 3.0 | TiN | 0.2 | 8.2 | 24.4 |
| Comparative Product 3 | TiN | 0.2 | TiCN | 2.0 | 2.2 | TiCNO | 0.2 | α | Al₂O₃ | 2.0 | TiN | 0.6 | 5.0 | 4.0 |
| Comparative Product 4 | TiN | 0.2 | TiCN | 3.0 | 3.2 | TiCNO | 2.8 | α | Al₂O₃ | 6.0 | TiN | 2.2 | 14.2 | 19.7 |
| Comparative Product 5 | TiN | 0.2 | TiCN | 3.0 | 3.2 | TiCNO | 1.0 | α | Al₂O₃ | 3.2 | TiN | 0.5 | 7.9 | 12.7 |
| Comparative Product 6 | TiN | 0.2 | TiCN | 3.0 | 3.2 | TiCNO | 1.0 | α | Al₂O₃ | 3.2 | TiN | 0.5 | 7.9 | 12.7 |
| Comparative Product 7 | TiN | 0.2 | TiCN | 1.0 | 1.2 | TiCNO | 1.0 | α | Al₂O₃ | 4.0 | TiCN | 1.8 | 8.0 | 12.5 |
| Comparative Product 8 | TiN | 0.2 | TiCN | 8.8 | 9.0 | TiCNO | 1.5 | α | Al₂O₃ | 1.0 | TiCN | 0.5 | 12.0 | 12.5 |
| Comparative Product 9 | TiN | 0.2 | TiCN | 5.0 | 5.2 | TiCNO | 1.0 | α | Al₂O₃ | 0.4 | TiCN | 1.2 | 7.8 | 12.8 |
| Comparative Product 10 | TiN | 0.2 | TiCN | 2.0 | 2.2 | TiCNO | 1.5 | α | Al₂O₃ | 8.0 | TiCN | 0.5 | 12.2 | 12.3 |
| Comparative Product 11 | TiN | 0.2 | TiCN | 3.0 | 3.2 | TiN | 1.0 | α | Al₂O₃ | 3.2 | TiN | 0.5 | 7.9 | 12.7 |

TABLE 3

| Sample number | Temperature (° C.) | Pressure (hPa) | Raw material gas composition (mol %) | | | | | |
|---|---|---|---|---|---|---|---|---|
| | | | $TiCl_4$ | CO | $AlCl_3$ | $N_2$ | HCl | $H_2$ |
| Invention Product 1 | 1000 | 100 | 1.2 | 0.8 | 0.0 | 40.0 | 4.0 | 54.0 |
| Invention Product 2 | 1000 | 100 | 1.2 | 0.8 | 0.0 | 50.0 | 4.0 | 44.0 |
| Invention Product 3 | 1020 | 100 | 1.2 | 0.8 | 0.0 | 40.0 | 3.0 | 55.0 |
| Invention Product 4 | 980 | 100 | 1.2 | 0.8 | 0.0 | 40.0 | 4.0 | 54.0 |
| Invention Product 5 | 1000 | 150 | 1.2 | 0.8 | 0.0 | 40.0 | 4.0 | 54.0 |
| Invention Product 6 | 1000 | 200 | 1.2 | 0.8 | 0.0 | 40.0 | 5.0 | 53.0 |
| Invention Product 7 | 1000 | 100 | 1.0 | 0.8 | 0.0 | 20.0 | 4.0 | 74.2 |
| Invention Product 8 | 1000 | 100 | 1.5 | 1.0 | 0.0 | 40.0 | 4.0 | 53.5 |
| Invention Product 9 | 1000 | 100 | 1.0 | 0.5 | 0.0 | 30.0 | 4.0 | 64.5 |
| Invention Product 10 | 1000 | 100 | 1.2 | 0.8 | 0.0 | 40.0 | 4.0 | 54.0 |
| Invention Product 11 | 1020 | 120 | 1.2 | 0.8 | 0.0 | 30.0 | 5.0 | 63.0 |
| Invention Product 12 | 1000 | 150 | 0.8 | 0.8 | 0.0 | 40.0 | 4.0 | 54.4 |
| Invention Product 13 | 980 | 70 | 2.0 | 0.8 | 0.0 | 40.0 | 4.0 | 53.2 |
| Invention Product 14 | 1000 | 100 | 1.2 | 0.8 | 0.0 | 0.0 | 3.0 | 95.0 |
| Invention Product 15 | 1000 | 100 | 1.2 | 0.8 | 2.0 | 40.0 | 4.0 | 52.0 |
| Invention Product 16 | 1000 | 100 | 1.2 | 0.5 | 0.0 | 40.0 | 4.0 | 54.3 |
| Comparative Product 1 | 950 | 100 | 1.2 | 0.5 | 0.0 | 40.0 | 4.0 | 54.3 |
| Comparative Product 2 | 1000 | 100 | 1.2 | 0.8 | 0.0 | 30.0 | 4.0 | 64.0 |
| Comparative Product 3 | 850 | 100 | 1.2 | 0.8 | 0.0 | 40.0 | 4.0 | 54.0 |
| Comparative Product 4 | 1050 | 70 | 1.0 | 0.8 | 0.0 | 40.0 | 4.0 | 54.2 |
| Comparative Product 5 | 1000 | 240 | 2.5 | 0.8 | 0.0 | 60.0 | 5.0 | 31.7 |
| Comparative Product 6 | 1000 | 50 | 0.5 | 0.8 | 0.0 | 15.0 | 0.0 | 83.7 |
| Comparative Product 7 | 1000 | 80 | 3.0 | 0.8 | 0.0 | 50.0 | 4.0 | 42.2 |
| Comparative Product 8 | 1000 | 100 | 1.0 | 0.8 | 0.0 | 40.0 | 4.0 | 54.2 |
| Comparative Product 9 | 900 | 100 | 1.2 | 0.8 | 0.0 | 40.0 | 4.0 | 54.0 |
| Comparative Product 10 | 1000 | 80 | 1.2 | 0.8 | 0.0 | 40.0 | 3.0 | 55.0 |
| Comparative Product 11 | 1000 | 100 | 1.2 | 0.0 | 0.0 | 40.0 | 4.0 | 54.8 |

[Average Thickness of Each Layer]

The average thickness of each layer of the obtained sample was obtained as follows. That is, an arithmetic mean value was obtained as the average thickness by measuring thicknesses of three points in a cross section in the vicinity of a position 50 μm from the cutting edge ridgeline portion of the coated cutting tool toward a center portion of a rake face using an FE-SEM. Measurement results are shown in Table 2.

[Composition of Each Layer]

The composition of each layer of the obtained sample was measured using EDS in the cross section in the vicinity of the position 50 μm from the cutting edge ridgeline portion of the coated cutting tool toward the center portion of the rake face. Measurement results are shown in Table 2.

[Length of CSL Grain Boundaries and Length of Σ3 Grain Boundaries]

The length of CSL grain boundaries and the length of Σ3 grain boundaries of the intermediate layer of the obtained sample were measured as follows. First, in the coated cutting tool, an observation surface was obtained by polishing until a cross section of the intermediate layer was exposed in a direction perpendicular to the surface of the substrate. Further, the obtained observation surface was polished using colloidal silica to obtain a mirror observation surface.

Then, the above observation surface was observed by an SEM equipped with EBSD. As an observation region, a flank was observed.

As the SEM, SU6600 (manufactured by Hitachi High-Tech Corporation) equipped with EBSD (manufactured by TexSEM Laboratories Inc.) was used.

The normal of the observation surface was tilted 70° with respect to an incident beam, and the analysis was performed by emitting an electron beam with an acceleration voltage of 15 kV and an irradiation current of 1.0 nA. Data collection was performed in steps of 0.1 μm/step for a point corresponding to a surface region having a length of 80% of the thickness of the intermediate layer×10 μm ((a length of 80% of the thickness of the intermediate layer (μm)×10)×100) on the observation surface. The data collection was performed for the surface region at 5 fields of view (a length of 80% of the thickness of the intermediate layer×10 μm), and an average value was calculated.

Data processing was performed using commercially available software. CSL crystal grain boundaries corresponding to any Σ value were counted, and were confirmed by expressing the ratio of each type of grain boundary as the ratio to the total crystal grain boundary. From the above, the length of the Σ3 grain boundaries, the length of the CSL grain boundaries, and the total length of the total grain boundary were obtained, and the ratio of the length of the CSL grain boundaries to the total length 100% of the total grain boundary and the ratio of the length of the Σ3 drain boundaries to the total length 100% of the CSL grain boundaries were calculated. Results are shown in Table 4.

TABLE 4

| | Intermediate layer | |
|---|---|---|
| | Ratio of length of CSL grain boundaries (%) | Ratio of length of Σ3 grain boundaries (%) |
| Invention Product 1 | 42 | 34 |
| Invention Product 2 | 38 | 36 |
| Invention Product 3 | 41 | 36 |
| Invention Product 4 | 32 | 40 |
| Invention Product 5 | 46 | 30 |
| Invention Product 6 | 24 | 30 |
| Invention Product 7 | 56 | 28 |
| Invention Product 8 | 38 | 36 |
| Invention Product 9 | 43 | 33 |
| Invention Product 10 | 41 | 36 |
| Invention Product 11 | 44 | 32 |
| Invention Product 12 | 46 | 16 |
| Invention Product 13 | 36 | 47 |
| Invention Product 14 | 45 | 29 |
| Invention Product 15 | 43 | 30 |
| Invention Product 16 | 38 | 37 |
| Comparative Product 1 | 34 | 35 |
| Comparative Product 2 | 45 | 32 |
| Comparative Product 3 | 33 | 38 |
| Comparative Product 4 | 53 | 30 |
| Comparative Product 5 | 15 | 36 |
| Comparative Product 6 | 67 | 22 |
| Comparative Product 7 | 36 | 40 |
| Comparative Product 8 | 44 | 31 |
| Comparative Product 9 | 40 | 34 |
| Comparative Product 10 | 42 | 35 |
| Comparative Product 11 | 32 | 36 |

A cutting test was performed under the following conditions by using the obtained Invention Products 1 to 16 and Comparative Products 1 to 11. Results of the cutting test are shown in Table 5.

[Cutting Test]
Insert: CNMG120408
Substrate: 89.2WC-8.8Co-2.0NbC (or more mass %)
Work material: SUS316L round bar (diameter 150 mm×length 400 mm)
Cutting speed: 150 m/min
Feed rate: 0.30 mm/rev
Depth of cut: 2.0 mm
Coolant: use Evaluation item: the tool life was defined as when a sample was fractured or the maximum flank wear width reached 0.3 mm, and the machining time until the tool life was measured.

TABLE 5

| Sample number | Cutting test Machining time (minutes) |
|---|---|
| Invention Product 1 | 19 |
| Invention Product 2 | 17 |
| Invention Product 3 | 15 |
| Invention Product 4 | 13 |
| Invention Product 5 | 17 |
| Invention Product 6 | 16 |
| Invention Product 7 | 15 |
| Invention Product 8 | 14 |
| Invention Product 9 | 20 |
| Invention Product 10 | 14 |
| Invention Product 11 | 22 |
| Invention Product 12 | 19 |
| Invention Product 13 | 16 |
| Invention Product 14 | 18 |
| Invention Product 15 | 20 |
| Invention Product 16 | 18 |
| Comparative Product 1 | 11 |
| Comparative Product 2 | 9 |
| Comparative Product 3 | 2 |
| Comparative Product 4 | 5 |
| Comparative Product 5 | 9 |
| Comparative Product 6 | 8 |
| Comparative Product 7 | 10 |
| Comparative Product 8 | 9 |
| Comparative Product 9 | 6 |
| Comparative Product 10 | 10 |
| Comparative Product 11 | 2 |

From results shown in Table 5, in the cutting test, the machining time until the tool life of each Invention Product was "13 minutes" or longer, which was longer than those of Comparative Products. Therefore, it can be seen that wear resistance and fracture resistance of invention Products are generally more excellent than those of Comparative Products.

From the above results, it was found that Invention Products have excellent wear resistance and fracture resistance, and as a result, have long tool lives.

INDUSTRIAL APPLICABILITY

Since the coated cutting tool of the invention has extended tool life as compared with that in the related art by having excellent wear resistance without lowering the fracture resistance, the coated cutting tool has industrial applicability from such a viewpoint.

REFERENCE SIGNS LIST

1: substrate, 2: lower layer, 3: intermediate layer, 4: upper layer, 5: outer layer, 6: coating layer, 7: coated cutting tool

What is claimed is:

1. A coated cutting tool, comprising:
a substrate; and
a coating layer formed on a surface of the substrate, wherein
the coating layer includes a lower layer, an intermediate layer, and an upper layer in this order from a substrate side to a surface side of the coating layer,
the lower layer includes one or more Ti compound layers formed of a Ti compound containing Ti and at least one element selected from the group consisting of C, N, and B, the intermediate layer contains TiCNO, TiCO, or TiAlCNO, the upper layer contains α-type Al2O3, an average thickness of the lower layer is 2.0 μm or more and 8.0 μm or less, an average thickness of the intermediate layer is 0.5 μm or more and 2.0 μm or less and is 10% or more and 20% or less of a thickness of the entire coating layer, an average thickness of the upper layer is 0.8 μm or more and 6.0 μm or less, and in the intermediate layer, a ratio of a length of CSL grain boundaries to a total length 100% of a total grain boundary is 20% or more and 60% or less, where the CSL grain boundaries include Σ3 grain boundaries, Σ5 grain boundaries, Σ7 grain boundaries, Σ9 grain boundaries, Σ11 grain boundaries, Σ13 grain boundaries, Σ15 grain boundaries, Σ17 grain boundaries, Σ19 grain boundaries, Σ21 grain boundaries, Σ23 grain boundaries, Σ25 grain boundaries, Σ27 grain boundaries, and Σ29 grain boundaries.

2. The coated cutting tool according to claim 1, wherein in the intermediate layer, a ratio of a length of Σ3 grain boundaries to a total length 100% of the CSL grain boundaries is 10% or more and less than 50%.

3. The coated cutting tool according to claim 2, wherein
the coating layer includes an outer layer on the upper layer and on a side opposite to the substrate side,
the outer layer includes a Ti compound layer formed of a Ti compound containing Ti and at least one element selected from the group consisting of C, N, and B, and
an average thickness of the outer layer is 0.2 μm or more and 4.0 μm or less.

4. The coated cutting tool according to claim 3, wherein the substrate is any one of cemented carbide, cermet, ceramics, or a cubic boron nitride sintered body.

5. The coated cutting tool according to claim 3, wherein an average thickness of the entire coating layer is 5.0 μm or more and 20.0 μm or less.

6. The coated cutting tool according to claim 5, wherein the Ti compound layer included in the lower layer is at least one selected from the group consisting of a layer formed of TiN, a layer formed of TiC, a layer formed of TiCN, and a layer formed of TiB2.

7. The coated cutting tool according to claim 6, wherein the substrate is any one of cemented carbide, cermet, ceramics, or a cubic boron nitride sintered body.

8. The coated cutting tool according to claim 2, wherein an average thickness of the entire coating layer is 5.0 μm or more and 20.0 μm or less.

9. The coated cutting tool according to claim 2, wherein the Ti compound layer included in the lower layer is at least one selected from the group consisting of a layer formed of TiN, a layer formed of TiC, a layer formed of TiCN, and a layer formed of TiB2.

10. The coated cutting tool according to claim 2, wherein the substrate is any one of cemented carbide, cermet, ceramics, or a cubic boron nitride sintered body.

11. The coated cutting tool according to claim 1, wherein
the coating layer includes an outer layer on the upper layer and on a side opposite to the substrate side,
the outer layer includes a Ti compound layer formed of a Ti compound containing Ti and at least one element selected from the group consisting of C, N, and B, and
an average thickness of the outer layer is 0.2 μm or more and 4.0 μm or less.

12. The coated cutting tool according to claim 11, wherein an average thickness of the entire coating layer is 5.0 μm or more and 20.0 μm or less.

13. The coated cutting tool according to claim 11, wherein the Ti compound layer included in the lower layer is at least one selected from the group consisting of a layer formed of TiN, a layer formed of TiC, a layer formed of TiCN, and a layer formed of TiB2.

14. The coated cutting tool according to claim 11, wherein the substrate is any one of cemented carbide, cermet, ceramics, or a cubic boron nitride sintered body.

15. The coated cutting tool according to claim 1, wherein an average thickness of the entire coating layer is 5.0 μm or more and 20.0 μm or less.

16. The coated cutting tool according to claim 15, wherein the Ti compound layer included in the lower layer is at least one selected from the group consisting of a layer formed of TiN, a layer formed of TiC, a layer formed of TiCN, and a layer formed of TiB2.

17. The coated cutting tool according to claim 15, wherein the substrate is any one of cemented carbide, cermet, ceramics, or a cubic boron nitride sintered body.

18. The coated cutting tool according to claim 1, wherein the Ti compound layer included in the lower layer is at least one selected from the group consisting of a layer formed of TiN, a layer formed of TiC, a layer formed of TiCN, and a layer formed of TiB2.

19. The coated cutting tool according to claim 18, wherein the substrate is any one of cemented carbide, cermet, ceramics, or a cubic boron nitride sintered body.

20. The coated cutting tool according to claim 1, wherein the substrate is any one of cemented carbide, cermet, ceramics, or a cubic boron nitride sintered body.

* * * * *